(12) United States Patent
Zink

(10) Patent No.: US 8,947,088 B2
(45) Date of Patent: Feb. 3, 2015

(54) MR SLIDE COIL

(75) Inventor: Stephan Zink, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 418 days.

(21) Appl. No.: 13/332,265

(22) Filed: Dec. 20, 2011

(65) Prior Publication Data

US 2012/0326719 A1 Dec. 27, 2012

(30) Foreign Application Priority Data

Dec. 21, 2010 (DE) .......................... 10 2010 063 724

(51) Int. Cl.
*G01V 3/00* (2006.01)
*G01R 33/3415* (2006.01)

(52) U.S. Cl.
CPC ................. *G01R 33/3415* (2013.01)
USPC .......................................... 324/318; 324/322

(58) Field of Classification Search
CPC .................................................. G01R 33/3415
USPC .................................. 324/318, 322, 314, 300
See application file for complete search history.

(56) References Cited

U.S. PATENT DOCUMENTS

| 4,897,604 A | * | 1/1990 | Carlson et al. | 324/318 |
| 5,897,268 A | * | 4/1999 | Deville | 403/109.5 |
| 6,453,190 B1 | * | 9/2002 | Acker et al. | 600/424 |

FOREIGN PATENT DOCUMENTS

| DE | 103 14 215 B4 | 11/2006 |
| DE | 10 2006 027 189 A1 | 12/2007 |

OTHER PUBLICATIONS

German Office Action dated Jul. 20, 2011 for corresponding German Patent Application No. DE 10 2010 063 724.6 with English translation.

* cited by examiner

*Primary Examiner* — Louis Arana
(74) *Attorney, Agent, or Firm* — Lempia Summerfield Katz LLC

(57) ABSTRACT

The present embodiments relate to a method and a local coil for a magnetic resonance tomography system. The local coil has an upper part and a lower part. The upper part and the lower part each have an inclined guide. When the upper part is positioned on the lower part, the upper part and the lower part may be displaced relative to each other along the inclined guides using an adjustment of a distance of the upper part from the lower part.

20 Claims, 4 Drawing Sheets

Overlapping and decoupling of the coil elements

POS. 1  POS. 2  POS. 3

FIG 2  Overlapping and decoupling of the coil elements

MR SLIDE COIL

This application claims the benefit of DE 10 2010 063 724.6, filed on Dec. 21, 2010.

BACKGROUND

The present embodiments relate to a magnetic resonance tomography (MRT) local coil for an MRT system.

Magnetic resonance tomography devices for examining objects or patients using magnetic resonance tomography (MRT, MRI) are known, for example, from DE10314215B4.

In MR imaging, elements known as local coils are adapted to the most disparate geometries of the human body. In order to cater to as broad a mass of patients as possible, the size of the local coils is geared to maximum dimensions of the respective part of the body. The result of this is the development trend directed toward adapting local coils in an optimal manner in terms of geometry. Since adjusting local coils proves difficult on account of electrical aspects, the coils may be implemented as rigid. Flexible coil elements provide a remedy. Individually flexible coil elements may also be provided.

SUMMARY

The present embodiments may obviate one or more of the drawbacks or limitations in the related art. For example, a magnetic resonance tomography local coil may be optimized.

The present embodiments enable coils to be used on patients of different body shape in an alternative way to flexible coils.

DETAILED DESCRIPTION OF THE DRAWINGS

Figure 4:
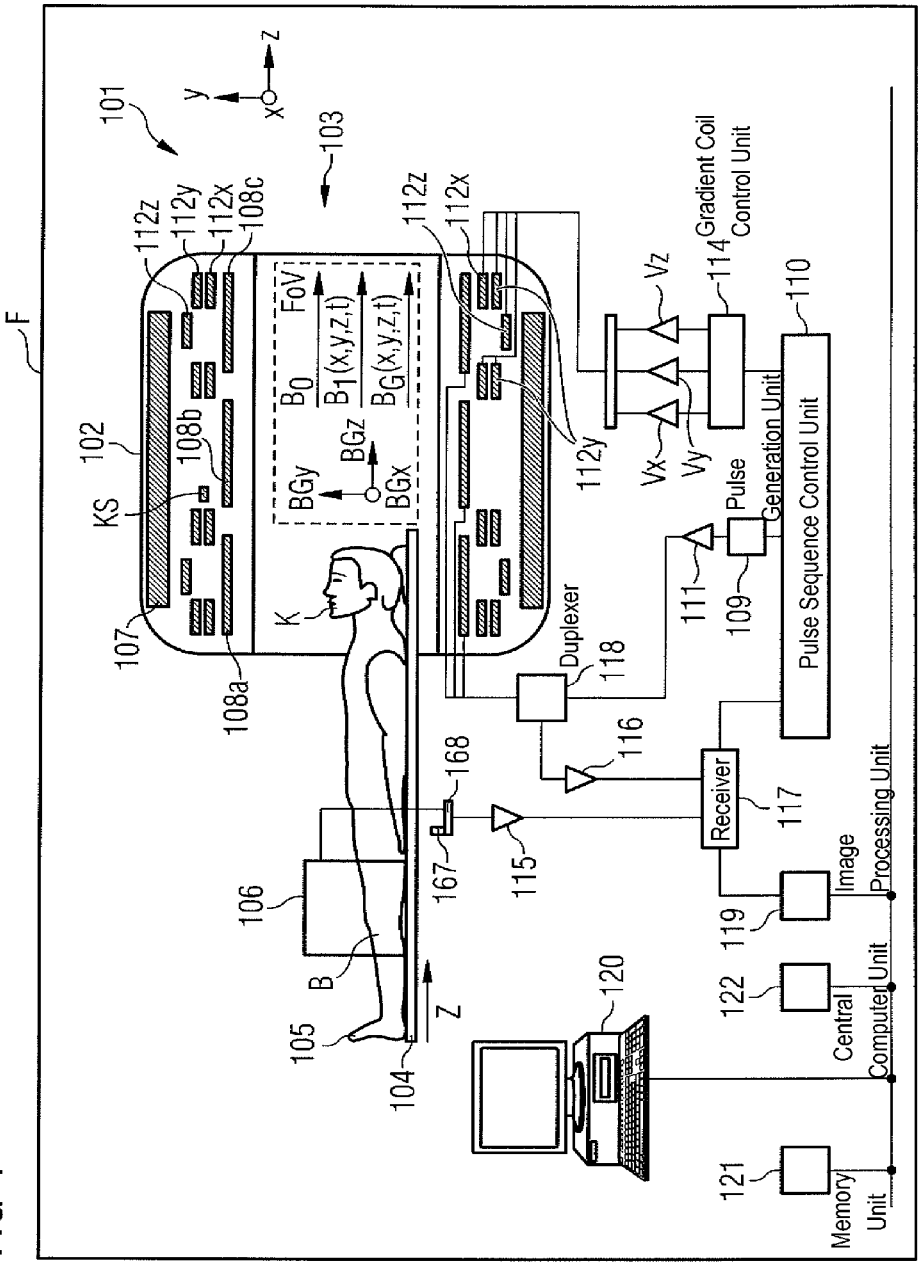
FIG. 4 shows an MRT system in a schematic simplified view.

FIG. 4 shows an imaging magnetic resonance device MRT 101 (e.g., contained in a shielded room or a Faraday cage F) including a whole-body coil 102. The whole-body coil 102 has, for example, a tubular bore 103, into which a patient couch 104 (e.g., a patient bed or table) bearing a body 105 (e.g., of an examination subject such as a patient; with or without a local coil arrangement 106) may be introduced in the direction of the arrow z in order to generate images of the patient 105 using an imaging method. Disposed on the patient 105 in FIG. 4 is the local coil arrangement 106, using which images of a partial region of the body 105 may be generated in a local area (e.g., a field of view (FOV)) of the imaging magnetic resonance device MRT 101. Signals of the local coil arrangement 106 may be evaluated (e.g., converted into images, stored or displayed) by an evaluation apparatus (e.g., including elements 168, 115, 117, 119, 120, and 121) of the MRT 101. The evaluation apparatus may be connected to the local coil arrangement 106, for example, by way of coaxial cables or wirelessly (e.g., element 167).

When the imaging magnetic resonance device MRT 101 is used in order to examine the body 105 using magnetic resonance imaging, different magnetic fields that are coordinated with one another with precision in terms of temporal and spatial characteristics are radiated onto the body 105. A strong magnet (e.g., a cryomagnet 107) in a measurement chamber having, for example, the tunnel-shaped bore 103 generates a strong static main magnetic field $B_0$ ranging, for example, from 0.2 Tesla to 3 Tesla or more. The body 105 that is to be examined, which is supported on the patient couch 104, is moved into a region of the main magnetic field $B_0$ that is approximately homogeneous in an area of observation FoV. Nuclear spins of atomic nuclei of the body 105 are excited by way of magnetic radio-frequency excitation pulses $B1(x, y, z, t)$ that are emitted via a radio-frequency antenna (and/or the local coil arrangement 106 if necessary). The radio-frequency antenna is depicted in FIG. 4 in simplified form as a body coil 108 (e.g., a multipart coil 108a, 108b, 108c). Radio-frequency excitation pulses are generated, for example, by a pulse generation unit 109 that is controlled by a pulse sequence control unit 110. Following amplification by a radio-frequency amplifier 111, the pulses are routed to the radio-frequency antenna 108. The radio-frequency system shown in FIG. 4 is indicated only schematically. In other embodiments, more than one pulse generation unit 109, more than one radio-frequency amplifier 111, and a plurality of radio-frequency antennas 108 a, b, c are used in a magnetic resonance device 101.

The imaging magnetic resonance device MRT 101 also has gradient coils $112x$, $112y$, $112z$, using which magnetic gradient fields are radiated in the course of a measurement in order to provide selective layer excitation and for spatial encoding of the measurement signal. The gradient coils $112x$, $112y$, $112z$ are controlled by a gradient coil control unit 114 that, like the pulse generation unit 109, is connected to the pulse sequence control unit 110.

Signals transmitted by the excited nuclear spins (e.g., the atomic nuclei in the examination subject) are received by the body coil 108 and/or at least one local coil arrangement 106, amplified by associated radio-frequency preamplifiers 116, and processed further and digitized by a receiving unit 117. The recorded measurement data is digitized and stored in the form of complex numeric values in a k-space matrix. An associated MR image may be reconstructed from the value-filled k-space matrix using a multidimensional Fourier transform.

In the case of a coil that may be operated in both the transmit mode and the receive mode, such as, for example, the body coil 108 or a local coil 106, correct signal forwarding is controlled by an upstream-connected duplexer 118.

From the measurement data, an image processing unit 119 generates an image that is displayed to a user via an operator console 120 and/or stored in a memory unit 121. A central computer unit 122 controls the individual system components.

In MR tomography as practiced today, images having a high signal-to-noise ratio (SNR) may be acquired using local coil arrangements (e.g., loops, local coils). The local coil arrangements are antenna systems that are mounted in immediate proximity to (e.g., on (anterior), under (posterior), or in) the body 105. In the course of an MR measurement, the excited nuclei induce a voltage in the individual antennas of the local coil. The induced voltage is amplified by a low-noise preamplifier (LNA) (e.g., a preamp) and forwarded to the receive electronics. High-field systems (e.g., 1.5 T and more) are employed even in the case of high-resolution images in order to improve the SNR. If more individual antennas may be connected to an MR receiving system than there are receivers present, a switching array (e.g., RCCS), for example, is installed between receive antennas and receivers. The switching array routes the currently active receive channels (e.g., receive channels currently lying in the field of view of the magnet) to the receivers present. This enables more coil elements to be connected than there are receivers available, since in the case of whole-body coverage, only coils that are located in the FoV or in the homogeneity volume of the magnet may be read out.

The local coil arrangement 106 serves to denote, for example, an antenna system that may consist of, for example, one antenna element or a plurality of antenna elements (e.g., coil elements) configured as an array coil. The individual antenna elements are implemented, for example, as loop antennas (e.g., loops) or as butterfly or saddle coils. The local coil arrangement includes, for example, coil elements, a preamplifier, further electronics (e.g., standing wave traps), a housing, supports, and a cable with a plug, using which the local coil arrangement is connected to the MRT system. A receiver 168 mounted on the system side filters and digitizes a signal received, for example, wirelessly by a local coil 106 and passes the data to a digital signal processing device that may derive an image or a spectrum from the data acquired using a measurement. The digital signal processing device makes the image or spectrum available to the user, for example, for subsequent diagnosis by him/her and/or for storage in a memory.

Some advantageous details of exemplary embodiments of MRT local coils according to the present embodiments are described in greater detail below with reference to FIGS. 1-3.

Figure 1:
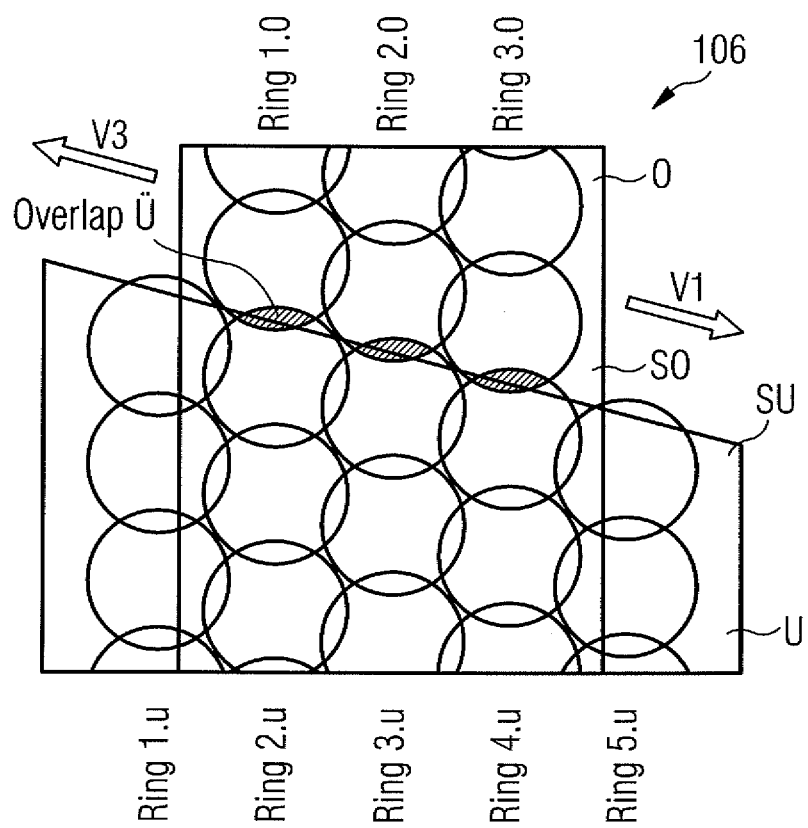
FIG. 1 shows a cross-section through an upper part and a lower part of a local coil.

FIG. 1 shows a cross-section through an upper part O and a lower part U of one embodiment of a local coil 106.

The upper part O is guided on the lower part U in, for example, a roughly U-shaped or V-shaped rail (e.g., on surfaces SO on a side of the upper part O and SU of the lower part U) and may be displaced relative to the lower part U in parallel with the rail in directions v1, v3 parallel to the rail (SO, SU) (e.g., with the upper part O positioned on the lower part U).

Figure 2:
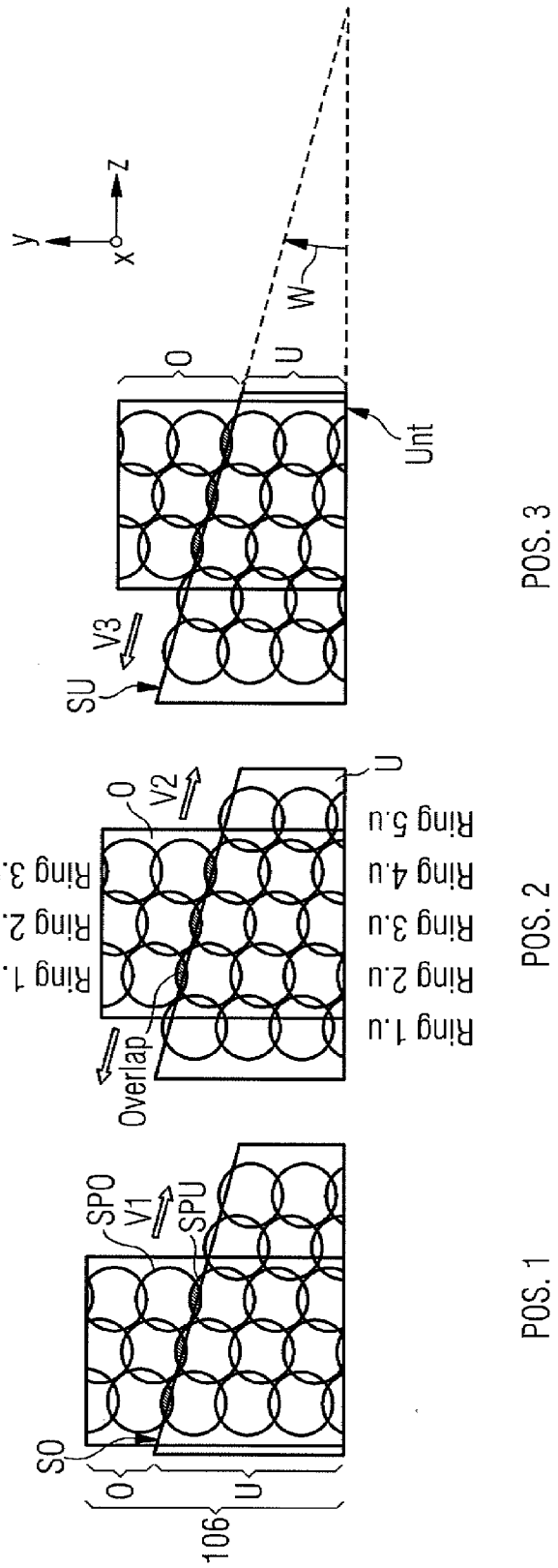
FIG. 2 shows a cross-section through an upper part and a lower part of a local coil in three different positions of the upper part relative to the lower part.

FIG. 2 shows a cross-section through the upper part O and the lower part U of one embodiment of a local coil 106.

Coil elements or, as referred to in the following, coil rings 1.*o* and 2.*o* and 3.*o* in the upper part O each overlap (e.g., possibly somewhat spatially offset at an incline in a direction x) completely or partially with one of a plurality of coil rings 1.*u*, 2.*u*, 3.*u*, 4.*u*, 5.*u* in the lower part U.

The surfaces SO, SU of the upper part O and the lower part U forming the guide rail (and hence displacement directions v1, v2, v3) both run at an incline. In other words, the surfaces SO, SU of the upper part O and the lower part U forming the guide rail both run at an angle w (e.g., greater than zero and less than ninety degrees, such as less than forty-five degrees and/or greater than 10 degrees) with respect to an underside Unt of the lower part U and/or to a supporting surface (e.g., for bearing on the patient couch 104) of the lower part U and/or to the inside IU of the lower part U, and/or to the inside IO of the upper part O.

Figure 3:
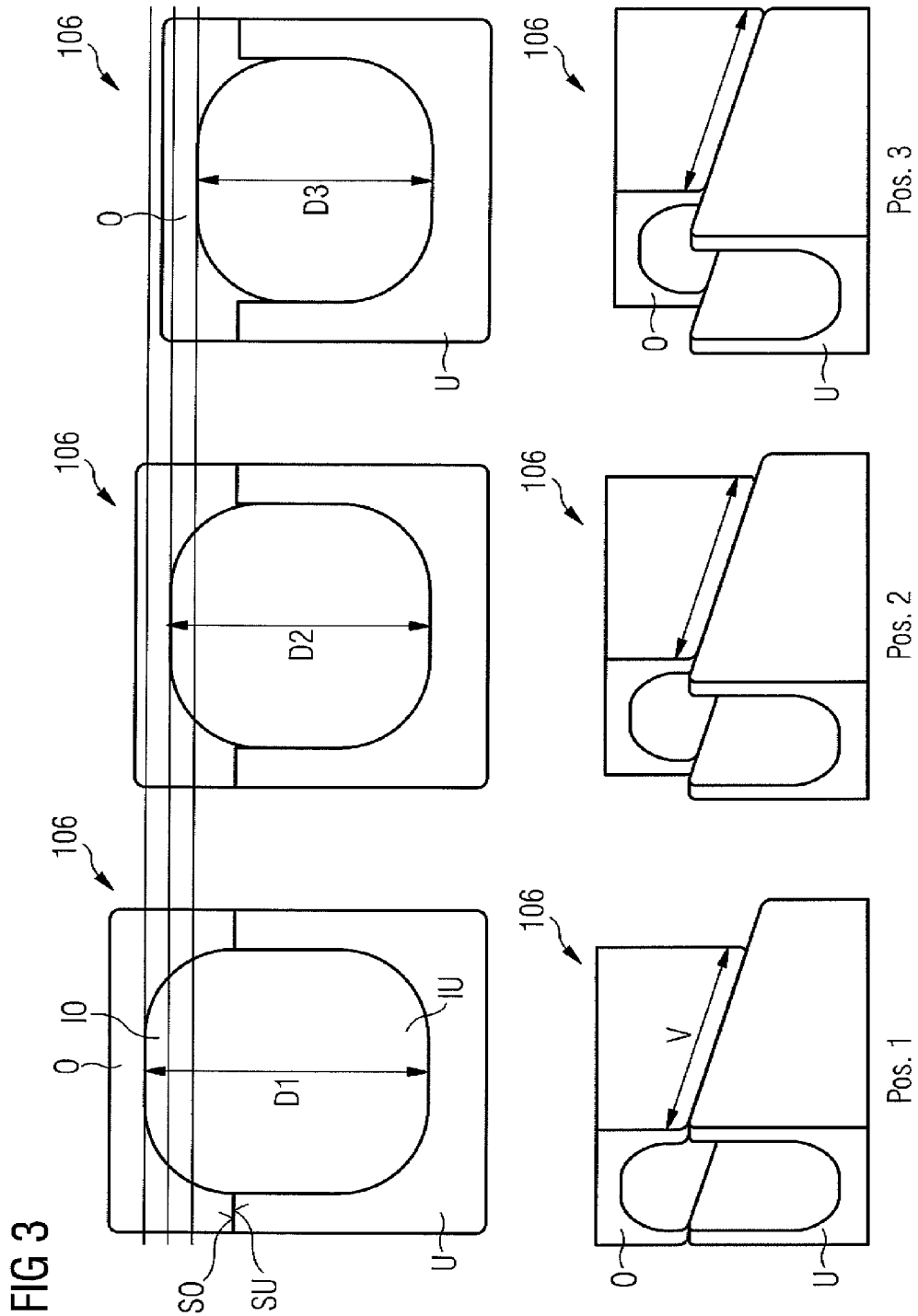
FIG. 3 shows a perspective view of an upper part and a lower part of a local coil.

As FIG. 3 shows in three views, when the upper part O is displaced v1, v2, v3 relative to the lower part U, there is a change in the distance D1, D2, D3 from the inside 10 of the upper part O facing toward the lower part U from the inside IU of the lower part U facing toward the upper part O (e.g., in the clear internal diameter (D1, D2, D3) of the local coil 106).

The distance D1 is greatest in a left-hand position Pos. 1 in FIG. 2, the distance D2 is less than D1 in a middle position Pos. 2 in FIG. 2, and the distance D3 is less than D1 and D2 in a right-hand position Pos. 3 in FIG. 2.

In the position Pos. 2 of the upper part O over the lower part U shown in the middle in FIG. 2, some of the coil elements (e.g., rings 1.*o*, 2.*o*, 3.*o*; 1.*u*, 2.*u*, 3.*u*, 4.*u*, 5.*u*) are deactivated. Some rings (e.g., 1.*u*, 5.*u*) of the lower part U are not coupled to all the rings (e.g., 1.*o*, 2.*o*, 3.*o*) of the upper part O by spatial overlap (e.g., they are decoupled).

An adjustment according to the present embodiments achieves an adaptation of the local coil 106 to the geometry of a body region B (e.g., a leg) of the examination subject 105 to be examined by way of an incline (e.g., the surfaces SO, SU forming the guide rail), on which the upper part O and the lower part U may be adjusted relative to each other. The lower part U is stationary (e.g., placed on the patient couch 104) and has a rail SU, in and along which the upper part O runs (e.g., in the directions v1, v2, v3). The rail is inclined at an angle w such that if the upper part O is displaced (e.g., in the directions v1, v2, v3), the internal diameter D1, D2, D3 of the local coil 106 changes perceptibly (e.g., see FIG. 3). At least three positions (e.g., Pos. 1, Pos. 2, Pos. 3) of the upper part O relative to the lower part U are provided. The Pos. 1 having the greatest diameter D1 may be adapted to the prevalent (e.g., for 95%, 99%, or 99.9% of patients) maximum diameter for the body region B in question (e.g., the leg B, the neck, a hand, an arm, the head, the stomach). Smaller geometries of the body region B may be well encompassed by Pos. 2 and Pos. 3 or further positions. Because of, for example, the guidance, the adjustment may be carried out with one hand and therefore ease of handling is provided for the medical staff.

An additional advantageous aspect for a high-quality local coil 106 is also the coupling or decoupling of some of the coil elements SPO (e.g., loops) of the upper part O and some of the coil elements SPU (e.g., loops) of the lower part U relative to one another. This is effected, for example, with equal surfaces in the overlap of the loops.

It is an advantage of one embodiment that even with an adjustment of the diameter D1/D2/D3, the overlap ÜB of the upper part O to the lower part U does not change. For this purpose, in an adjustment by one coil ring (e.g., 1.*u*, 2.*u*, 3.*u*) of the lower part U at a time, the upper part O "travels" further (in FIG. 3, from the left-hand illustration Pos. 1 through the middle illustration Pos. 2 to the illustration on the right Pos. 3). Thus, for example, at the greatest setting D1 in Pos. 1, the ring 1.*o* of the upper part O overlaps (e.g., partially) ring 1.*u* of the lower part U, as does ring 2.*o* ring 2.*u*, and ring 3.*o* ring 3.*u*. At Pos. 2 and Pos. 3, the upper part O travels one ring further in each case. Depending on the position of the upper part O, the rings not required (e.g., two rings) are deactivated (e.g., not overlapped) and consequently do not affect the three active coil elements. The number of adjustment positions is dependent, for example, on a ratio of ring numbers of the upper part O to the lower part U. The loops may be adjusted at intervals of precisely one ring (e.g., including through small elevations/depressions/constrictions/stops in the rail SO, SU). In other words, an infinitely variable adjustment may not be provided.

A potential advantage of the present embodiments lies in the possibility of realizing an adaptable coil 106 that contains no flexible parts. By virtue of this fixed adjustment of the coil, good reproducibility of the measurement may be achieved. An optimal adjustment to the body region B that is to be examined is also possible. A precise decoupling of the desired coil elements with respect to one another may be effected. The displacement mechanism provides easy operator control and adjustment to the respective part of the body. The risk of pinching and jamming is also reduced as a result. A good and rapid workflow is possible.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance tomography system, the local coil comprising:
    an upper part; and
    a lower part,
    wherein the upper part and the lower part each have an inclined guide, and
    wherein when the upper part is positioned on the lower part, the upper part and the lower part are displaceable relative to each other along the inclined guide using an adjustment of a distance of the upper part from the lower part.

2. The local coil as claimed in claim 1, wherein the inclined guides run parallel to a direction of a displacement of the upper part relative to the lower part.

3. The local coil as claimed in claim 1, wherein the inclined guides, surfaces of the upper part and lower part forming the inclined guides, or the inclined guides and the surfaces of the upper part and the lower part forming the inclined guides run obliquely at an angle to at least one of an underside of the lower part, a couch supporting surface of the lower part, the inside of the lower part, and the inside of the upper part.

4. The local coil as claimed in claim 1, wherein the distance of the upper part from the lower part is a distance, clearance or greatest distance between a side of the upper part facing toward the lower part and a side of the lower part facing toward the upper part.

5. The local coil as claimed in claim 1, wherein the distance is a height of an open or closed volume formed between the upper part and the lower part, and
    wherein a partial region of a body that is to be examined is accommodatable or enclosable in the volume.

6. The local coil as claimed in claim 1, wherein the lower part comprises a rail, in which the upper part is displaceable in only one direction.

7. The local coil as claimed in claim 6, wherein inclines of the inclined guides, the rail, or the inclined guides and the rail run at an angle exclusively between zero and ninety degrees to a lower surface of the lower part in a usage position in a magnetic resonance tomography (MRT) device.

8. The local coil as claimed in claim 1, wherein inclines of the inclined guides run at an angle exclusively between zero and ninety degrees to a lower surface of the lower part in a usage position in a magnetic resonance tomography (MRT) device.

9. The local coil as claimed in claim 1, wherein the upper part is positionable in three or more positions on the lower part.

10. The local coil as claimed in claim 1, wherein in a position having the greatest distance of the upper part from the lower part, the distance corresponds at least to a maximum diameter of a body region that is to be examined for a specific percentage of examination subjects.

11. The local coil as claimed in claim 1, wherein the size of an overlap between the upper part and the lower part does not change when the upper part is displaced relative to the lower part.

12. The local coil as claimed in claim 1, wherein when the upper part is displaced relative to the lower part with a reduction in the distance, a plurality of alternative positions of the upper part relative to the lower part, in which one ring of the upper part is located spatially above one ring of the lower part, is provided.

13. The local coil as claimed in claim 1, wherein coil elements of the upper part and coil elements of the lower part are deactivated depending on a position of the upper part over the lower part.

14. The local coil as claimed in claim 13, wherein one or some of the coil elements of the lower part are decoupled with respect to all the coil elements of the upper part.

15. The local coil as claimed in claim 13, wherein the upper part is displaceable relative to the lower part only at intervals corresponding to distances of the coil elements of the upper part and the coil elements of the lower part.

16. The local coil as claimed in claim 15, wherein the upper part is displaceable relative to the lower part using an adjustment that is not infinitely variable.

17. The local coil as claimed in claim 1, wherein an internal diameter of the local coil is formed without parts that are flexible.

18. A local coil for a magnetic resonance tomography system, the local coil comprising:
    an upper part;
    a lower part; and
    coil elements,
    wherein the upper part and the lower part each have an inclined guide,
    wherein when the upper part is positioned on the lower part, the upper part and the lower part are displaceable relative to each other along the inclined guide using an adjustment of a distance of the upper part from the lower part, and
    wherein all or some of the coil elements of the local coil are coupled to one another.

19. The local coil as claimed in claim 18, wherein the coupled coil elements are coupled to one another with equal surfaces in an overlap of two of the coil elements.

20. A method for adjusting an internal diameter of a local coil for a magnetic resonance tomography system, the local coil including an upper part and a lower part, the upper part and the lower part each including an inclined guide on one side, the method comprising:
    displacing the upper part of the local coil and the lower part of the local coil relative to each other along the inclined guides using an adjustment of a distance of the upper part of the local coil from the lower part of the local coil when the upper part of the local coil is positioned on the lower part of the local coil.

* * * * *